United States Patent [19]

Dumoulin

[11] Patent Number: 4,680,546

[45] Date of Patent: Jul. 14, 1987

[54] METHODS OF, AND PULSE SEQUENCES FOR, THE SUPRESSION OF UNDESIRED RESONANCES BY GENERATION OF QUANTUM COHERENCE IN NMR IMAGING AND SPECTROSCOPY

[75] Inventor: Charles L. Dumoulin, Ballston Lake, N.Y.

[73] Assignee: General Electric Company, Schenectady, N.Y.

[21] Appl. No.: 822,730

[22] Filed: Jan. 27, 1986

[51] Int. Cl.⁴ .......................................... G01R 33/20
[52] U.S. Cl. ................................. 324/307; 324/300
[58] Field of Search ............... 324/300, 307, 309, 311, 324/312, 313, 314

[56] References Cited

U.S. PATENT DOCUMENTS

| | | | |
|---|---|---|---|
| 4,134,058 | 1/1979 | Ernst | 324/308 |
| 4,238,735 | 12/1980 | Muller | 324/310 |
| 4,510,449 | 4/1985 | Ernst et al. | 324/309 |

OTHER PUBLICATIONS

"Solvent Suppression in Fourier Transform Nuclear Magnetic Resonance", PJ Hore, 55 J. Magn. Reson. 283-300, (1983).

*Primary Examiner*—Michael J. Tokar
*Attorney, Agent, or Firm*—Geoffrey H. Krauss; James C. Davis, Jr.; Marvin Snyder

[57] ABSTRACT

Methods for generating non-single-quantum coherences and suppress single-quantum coherences, such as from water molecules, use a pulse subsequence, prior to a normal excitation/response signal sequence in Nuclear Magnetic Resonance imaging and/or spectroscopy, to constructively sum image signals exhibiting multiple quantum behavior, while subtracting pairs of response signals originating in noncoupled-spin systems. A variety of multistep phase-cycling programs for achieving zero-quantum and multiple-quantum filtering are disclosed.

20 Claims, 21 Drawing Figures

METHODS OF, AND PULSE SEQUENCES FOR, THE SUPRESSION OF UNDESIRED RESONANCES BY GENERATION OF QUANTUM COHERENCE IN NMR IMAGING AND SPECTROSCOPY

BACKGROUND OF THE INVENTION

The present invention relates to Nuclear Magnetic Resonance (NMR) imaging and spectroscopy and, more particularly, to novel pulse sequences for the generation of quantum coherence of other than the first order, to suppress response signal generation by the resonance of at least one undesired nuclear species present in the sample being investigated.

It is well known that, due to its relatively great natural abundance and high gyromagnetic ratio (about 42.58 MHz/T), the most readily observed species of nuclei is $^1H$. It is also well known that biological material contains a large amount of $^1H$ nuclei, most of which are contained in water ($H_2O$) molecules. Accordingly, it is by far easier to measure the amount, and the associated constants $T_1$ and $T_2$, of $^1H$ nuclei in water molecules than it is to measure the amount, and/or constants $T_1$ and $T_2$, of any other $^1H$-containing nuclear species. While it is often desirable to observe these other species, which typically yield information as to the presence and relative naturally-occurring concentration of many metabolites in areas/organs of interest, it is usually difficult to so observe these other nuclear species in practice. The modern NMR imager and/or spectrometer has the capability to be tuned to the NMR response signals radiated by the other species, but the intensity of the NMR response signal radiated by the $H_2O$ molecules, in that same biological sample, renders the other species NMR response signal unobservable. Thus, it is highly desirable to provide a procedure by which the NMR response signal from an undesired nuclear species, such as the $^1H$ NMR response signal from the water molecule, can be selectively eliminated to render more easily observable the NMR response signals of other species, and especially those NMR response signals of other species of the same type of nucleus.

PRIOR ART

Suppression of the water response signal in NMR spectra has been one area of great activity in the past several years. The majority of available water-suppression techniques, to date, can be partitioned into two categories: in the first category, excitation of the water molecule resonance is avoided, to greater or lesser extent, by one of selective-excitation or cross-correlation methods; in the second category, the resonance is excited and an attempt is made to eliminate the water molecule response signals is made at the time at which acquisition of the NMR response signals from the desired species is supposed to occur. The elimination attempt is usually made by either (1) the selective saturation of the $H_2O$ resonance, or (2) the inversion of the $H_2O$ resonance and subsequent passage of sufficient time (e.g. $0.693 \cdot T_1$) for the NMR response signal of the undesired resonance to evolve to be at an essentially zero amplitude during data acquisition. A review of existing water suppression techniques for high-resolution spectroscopy may be found in an article "Solvent Suppression in Fourier Transform Nuclear Magnetic Resonance" by P. J. Hore, in 55 J. Magn. Reson. 283 (1983). These methods do not, in practice, provide total suppression and, to the detriment of the experiment-in-progress, frequently distort the spectrum of the NMR response signals in the region of the water resonances. Also, since all of these methods (with the exception of $T_1$ nulling techniques) discriminate against the chemical-shift of the water resonances, these methods are not especially useful in achieving suppression of $H_2O$ NMR response signals in NMR images.

BRIEF SUMMARY OF THE INVENTION

In accordance with the invention, a method for suppressing undesired NMR response signals while obtaining desired NMR signals from a sample containing like nuclei which are coupled to one another, comprises the step of preceding each NMR response-signal-evoking excitation signal sequence with a pulse subsequence having ratio-frequency (RF) pulses, each of phase predeterminately selected for generating at least one selected one of zero-quantum and multiple-quantum coherence of the spin populations in an NMR spin system. Any spin resonance, such as the $^1H$ resonance, will not exhibit zero/multiple quantum behavior and, therefore, will be given a different intensity and phase by the zero/multiple-quantum subsequence. The multiple/zero-quantum coherence, while not directly observable, can be observed responsive to a detection pulse applied to the sample after the zero/multiple quantum coherence subsequence. The phases of the detection pulse signal and the received signal are so manipulated as to cause a single-quantum-coherence signal to be cancelled and to cause constructive addition of a signal with the selected one of the zero-quantum coherence or the multiple-quantum coherence. Thus, NMR response signals having non-single-quantum behavior are selectively detected, while single-quantum signals, such as arise from $H_2O$, are suppressed. Enhancement of this desired suppression may be obtained by utilizing the zero-quantum/multiple-quantum excitation subsequence with either (1) a chemically-selective saturation pulse signal applied to the undesired, e.g. water, resonance, or (2) an inversion pulse signal, followed by a delay time interval predeterminately selected to situate the undesired nuclear species at its $T_1$ response null (i.e., the delay time is equal to $0.693 \cdot T_1$ for the undesired hydrogen nuclei in water). Similarly, other presaturation techniques and/or selective-excitation techniques can be combined with my novel non-single-quantum coherence generating subsequence to even further enhance its effectiveness in the acquisition of both images and spectra.

Accordingly, it is one object of the present invention to provide a method for suppression of undesired NMR response signals from nuclear species having a single-quantum coherence and for enhancing the NMR response signals from nuclear species having one of zero-quantum or multiple-quantum coherence.

This and other objects of the present invention will become apparent to those skilled in the art, upon consideration of the following detailed description of the invention, when read in conjunction with the drawings.

DETAILED DESCRIPTION OF PRESENTLY PREFERRED EMBODIMENTS

In order to more fully appreciate my novel methods of suppression of undesired NMR resonance response signals, a somewhat abbreviated explanation of several factors governing the spectral characteristics of NMR response signals will be initially described.

Figure 1A:
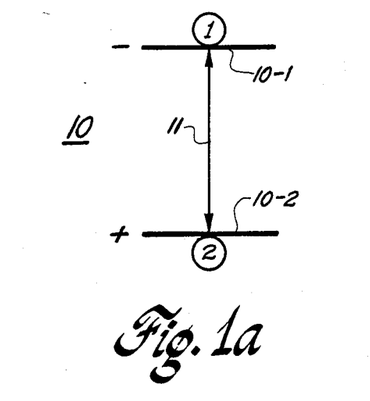
FIGS. 1a and 1b are, respectively, a spin-state diagram for a non-coupled spin-$\frac{1}{2}$ nucleus, and an amplitude graph, in the frequency domain, for the NMR response characteristic of that spin.
Figure 1B:
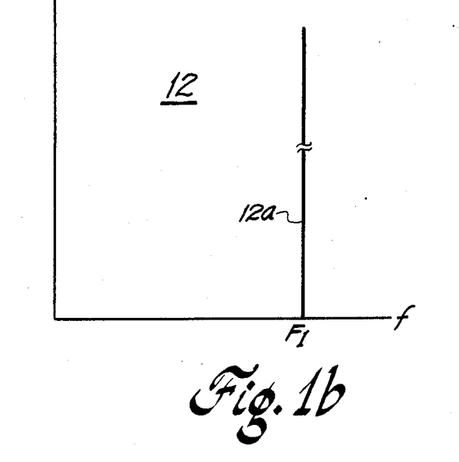

Referring first to FIGS. 1a and 1b, in the simplest case a molecule has a single hydrogen atom with the single proton in the nucleus thereof having a spin of one-half. This spin-½ nucleus is isolated from, i.e. non-coupled to, all other nuclei. When placed in a magnetic field, there are only two energy states in which the nucleus can be found, e.g. a spin-down, or (−), state (condition 1) illustrated by a first energy level 10-1 in a state system 10, or a spin-up, or (+), state (condition 2) illustrated by a second energy level 10-2. Only one possible quantum transition 11, between levels 10-1 and 10-2, exists. The stimulation energy E needed to raise a nucleus from the lower-energy level 10-2 to the higher-energy level 10-1 is the same magnitude as the energy E released when that nucleus falls from the higher-energy level 10-1 to the lower-energy level 10-2, and is a fixed quantity $E = h \cdot \nu$, where h is Planck's constant and $\nu$ is the frequency $7_1$ of the single energy quantum involved. Because the transition has a net magnetization of $\pm 1$, it is referred to as a single-quantum transition. Single-quantum transitions are the only transitions which are presently directly observable in an NMR image. The two protons in $H_2O$ are identical, so that the two pair of energy levels thereof align themselves such that only the one allowable transition 11 appears and results in a single spectral line 12a in the frequency spectrum 12 of the electromagnetic energy involved in the transition. It will be seen that any effect causing a frequency-shift in the output spectra 12 of these nuclei will not be obscured by other spectral lines, as no other line exists in spectrum 12.

Figure 2A:
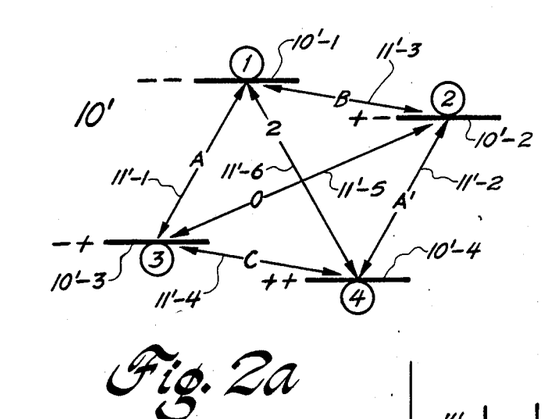
FIGS. 2a and 2b are, respectively, a spin-state diagram for a pair of coupled spin-½ nuclei, and an amplitude graph, in the frequency domain, for the NMR response characteristic of that spin pair.
Figure 2B:
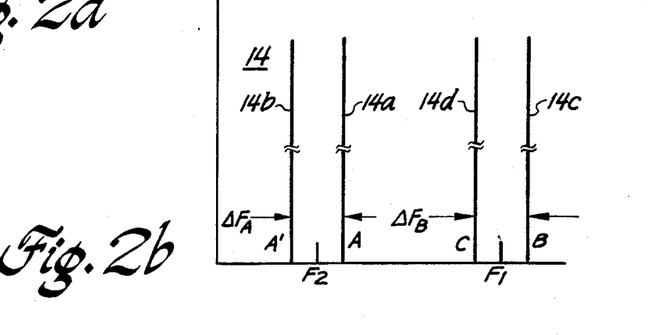

Referring next to FIGS. 2a and 2b, in a more complex system, a molecule (such as that of a lipid or the like material) has a pair of like atoms with the nuclei thereof coupled to one another; therefor, each nucleus is not isolated from all other nuclei. For simplicity of explanation, each of the nuclei will be considered to have a spin of one-half. There are only two energy states (E) in which each of the (N=2) nuclei can be found, so that the combination of the pair of coupled nuclei can be in only one of $N \times E = 2 \times 2 = 4$ possible conditions, at any time: both nuclei can be in the spin-down state (condition 1) illustrated by a first energy level 10'-1 in a state system 10'; a first nucleus can be in the spin-up (+) state while the second nucleus is in the spin-down (−) state (condition 2) illustrated by a second energy level 10'-2; the second nucleus can be in the spin-up (+) state while the first nucleus is in the spin-down (−) state (condition 3) illustrated by a third energy level 10'-3; or both nuclei can be in the spin-up (+) state (condition 4) illustrated by a fourth energy level 10'-4. A total of six possible transitions now exist. Consider first the four possible single transitions: a first single transition 11'-1 (e.g., between levels 10'-1 and 10'-3) involves only the second nucleus, with the first nucleus in the spin-down (−) state, and is characterized by an energy difference A, to which a first spectral line 14a corresponds in the resonance spectrum 14. A single transition 11'-2 of the same second nucleus with the first nucleus now in the spin-up (+) state (e.g., between levels 10'-2 and 10'-4), is characterized by an energy difference A', to which a second spectral line 14b corresponds. If the first nucleus is the sole nucleus to change state, a different pair of transitions occurs; thus, a single transition 11'-3 of only the first nucleus (e.g., between levels 10'-1 and 10'-2), with the second nucleus in the spin-down (−) state, is characterized by an energy difference B, to which a third spectral line 14c corresponds in the resonance spectrum 14. A single transition 11'-4 of the same first nucleus with the second nucleus now in the spin-up (+) state (e.g., between levels 10'-3 and 10'-4), is characterized by an energy difference C, to which a fourth spectral line 14d corresponds. Thus, the doublet of transitions 11'-1 and 11'-2 arises from the same (second) spin, which, due to splitting effect of the coupled (first) spin, will generate a pair of frequency-spectra response lines 14a and 14b displaced about a center frequency $7_2$ (the single resonance frequency obtained from the single transition obtained from the second nucleus in the absence of coupled-spin splitting effects), and having a frequency separation $dF_A$ which is determined by the magnitude of the spin-spin coupling constant J and will be substantially symmetrical about the $7_2$ frequency.

Similarly, the doublet of transitions 11'-3 and 11'-4 arises from the same (first) spin, which, due to splitting effects of the coupled (second) spin, will generate a pair of frequency-spectra response lines 14c and 14d displaced about a center frequency $7_1$ (the single resonance frequency obtained from the single transition of the first nucleus in the absence of coupled-spin splitting effects), and having a frequency separation $dF_B$ which is again determined by the magnitude of the coupling constant J and will be substantially symmetrical about the $7_1$ frequency. These are the only transitions which are presently directly observable in an NMR image.

There are two additional transitions which can occur; these transitions requires that the spins of both nuclei simultaneously flip. The correlation between two different states of spin magnetization is known as a coherence; unlike the single-quantum coherences generated by a single flip of a single nucleus, simultaneous changes in spin of a plurality of nuclei lead to non-single-quantum coherences, i.e., a net magnetization change of 0 (referred to as a zero-quantum coherence) or a net magnetization change of ±M units, where M is an integer greater than one (referred to as a multiple-quantum coherence). If each of the pair of nuclei had a spin direction opposite to the spin direction of the other nucleus prior to the double-flip event (e.g., the first nucleus is in the spin-down (−) state and the second nucleus is in the spin-up (+) state, as at condition 10'-3) and each has a different spin direction which is still opposite to that of the other nucleus after the double-flip event (e.g., the first nucleus is now in the spin-up (+) state, and the second nucleus is in the spindown (−) state, as at condition 10'-2), then a zero-order quantum, coherence is generated by the fifth possible transition 11'-5. The zero-quantum transition energy corresponds not to the difference in Larmor frequencies of the involved nuclei, but to the difference in chemical shifts (i.e., the peak offset frequency of the response signal, with respect to the excitation signal frequency). The zero-quantum transition is particularly useful as line broadening effects (due to field inhomogeneities and the like) are cancelled; the line width of zero-quantum transitions is thus determined by the $T_2$ time constant, rather than by $T_2^*$. If each of the pair of nuclei had a spin direction identical to the spin direction of the other nucleus prior to the double-flip event (e.g., the first and second nuclei are both in the spin-down state, as at condition 10'-1) and each has a different spin direction which is still opposite to that of the other nucleus after the double-flip event (e.g., the first and second nuclei are both in the spin-up state, as at condition 10'-4), then a second-order quantum coherence is generated by this sixth possible transition 11'-6. The double-quantum transition energy corresponds not to the sum of Larmor frequencies of the pair of nuclei involved, but to the sum of the involved chemical shifts relative to the exact excitation transmitter frequency. These zero-order and multiple-order quantum coherences thus generate relatively low frequency response signals, which (unlike the single-quantum transitions which generate magnetizations in the transverse plane of the spin system) are not presently directly observable. A system having N nuclei can have a maximum N-order coherence; no coherence higher than second-order can be present in this two-nucleus system.

Figure 3A:
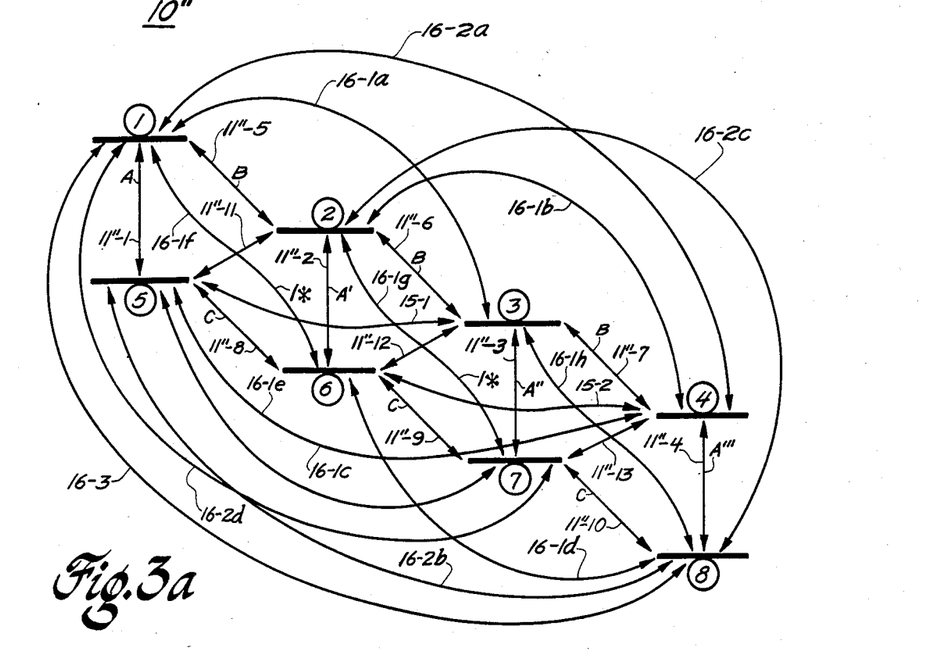
FIGS. 3a and 3b are, respectively, a spin-state diagram for four spin-½ nuclei in an $AB_3$ spin system, and an amplitude graph, in the frequency domain, for the NMR response characteristic of that $AB_3$ spin system.
Figure 3B:
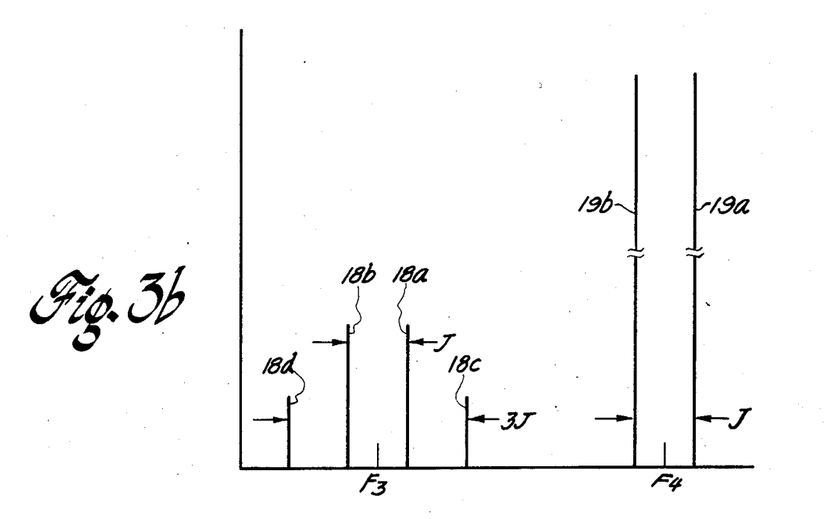

Referring now to FIGS. 3a and 3b, an even more complex molecule (such as a simple organic substance, e.g., lactic acid) may have a fairly large number of atoms in each molecule. By way of example only, consider the simplified spin-density matrix for a molecule having four coupled atoms and of the form $AB_3$, i.e., with one atom A and three homonuclear atoms B:

| Magnetization State | S | T | U | V | W | X | Y | Z |
|---|---|---|---|---|---|---|---|---|
| S:M1=+3/2,M2=+1/2 | — | 1e | 2 | 3 | 1a | 2 | 3 | 4 |
| T:M1=+1/2,M2=+1/2 |  | — | 1e | 2 | 0 | 1b | 2 | 3 |
| U:M1=−1/2,M2=+1/2 |  |  | — | 1e | 1* | 0 | 1c | 2 |
| V:M1=−3/2,M2=+1/2 |  |  |  | — | 2 | 1* | 0 | 1d |
| W:M1=+3/2,M2=−1/2 |  |  |  |  | — | 1f | 2 | 3 |
| X:M1=+1/2,M2=−1/2 |  |  |  |  |  | — | 1f | 2 |
| Y:M1=−1/2,M2=−1/2 |  |  |  |  |  |  | — | 1f |
| Z:M1=−3/2,M2=−1/2 |  |  |  |  |  |  |  | — | where spin density states 0 represent the zero-quantum coherences; states 1a-1f represent six different simple single-quantum coherences; states 1* represent combinational single-quantum coherences; and states 2,3 and 4 respectively represent the double-, triple- and quadruple-quantum coherences. As shown in an alternate manner in FIG. 3a, the four nuclei will generate a total of $N \times E = 4 \times 2 = 8$ energy levels 10"-1 through 10"-8, in energy-level diagram 10", but will have a total of twenty-eight possible transitions! This transition total includes: a quartet of simple single-quantum transitions for the A nucleus (i.e., transitions 11"-1 through 11"-4); a trio of single-quantum transitions 11"-5 through 11"-7 for each of the B nuclei, with a first spin-state of the A nucleus, and a trio of single-quantum transitions 11"-8 through 11"-10, for each of the B nuclei for the other spin state of the A nucleus; a trio of zero of zero-quantum coherence generating transitions 11"-11 through 11"-13, involving simultaneous flips, in opposite directions, of the A nucleus and a different one of the three B nuclei; a pair of single-quantum combinations 15-1 and 15-2, each having a plurality of spin flips which result in a net single-quantum transition; two pair of double-quantum coherence generating transitions, including a first pair 16-1a and 16-1b (which occur for the first A nucleus spin-state) and a second pair 16-1c and 16-1d (which occur for the other spin-state of the A nucleus); four combinational double-quantum transitions 16-1e through 16-1h; four triple-quantum coherence generating transitions 16-2a through 16-2d; and (as the highest order is equal to the number N=4 of involved nuclei) a quadruple-quantum coherence generating transition 16-3. Only the normal single-quantum coherence generating transitions provide response spectrum signal portions which can be directly obtained and utilized for NMR imaging and/or spectroscopy. Thus, the four single transitions 11"-1 through 11"-4 provide a tetrad of resonance spectral lines 18a-18d, centered around the non-coupled resonance frequency $7_3$ of the A nucleus, and having frequency separations (typically less than 1000 Hz. for protons) which are multiples of the coupling constant J. Each trio of nuclei B transitions 11"-5 through 11"-7 or 11"-8 through 1"-10 establishes one of the dual resonance spectral lines 19a and 19b (which are actually triple-degenerate resonances), centered around the resonance frequency $7_4$ of the B nuclei, and also having a frequency separation related to the constant J of the spin-spin coupling between different nuclei. Because the spatial coupling arrangements between the various nuclei determine the magnitude of the energy differences establishing the non-single-quantum coherences, it is desirable to obtain response data from at least one of the remaining coherences, so as to avoid the previously discussed problems due to the exceptionally strong single-quantum coherences due to large quantities of water and like matter in biological samples under investigation.

Figure 4:
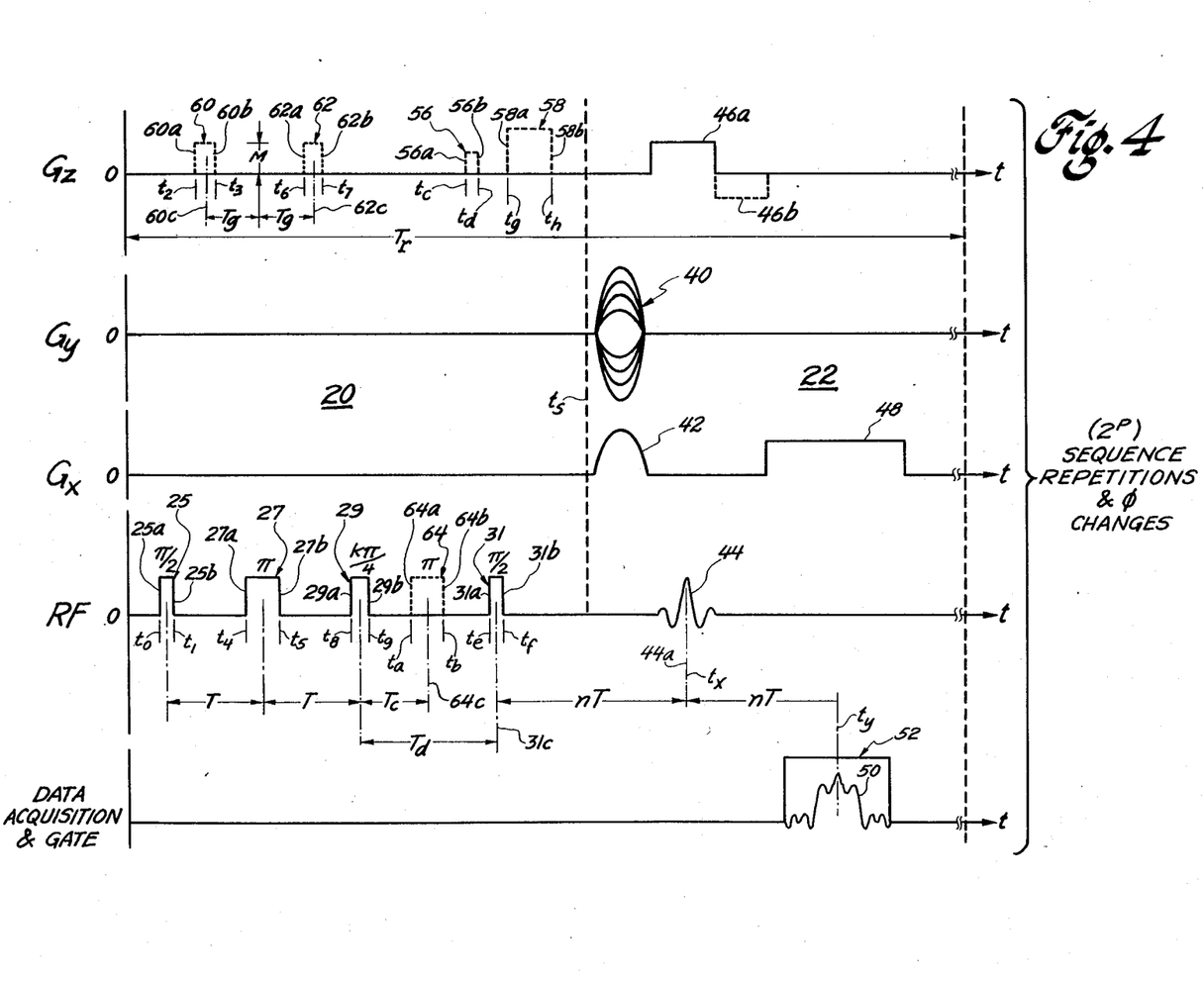
FIG. 4 is a set of time-coordinated signal waveforms for the magnetic field gradients, the radio-frequency excitation and the data acquisition and gating signals in exemplary presently-preferred embodiments of the non-single-quantum coherence generating subsequence of the present invention, and of a spin-warp signal imaging sequence used therewith.
Figure 4A:
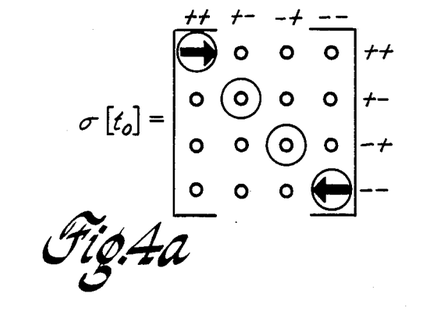
FIGS. 4a–4f are a set of spin-density matrices, illustrating the state of an AB spin system at selected times in the subsequence of FIG. 4.
Figures 4B, 4E:
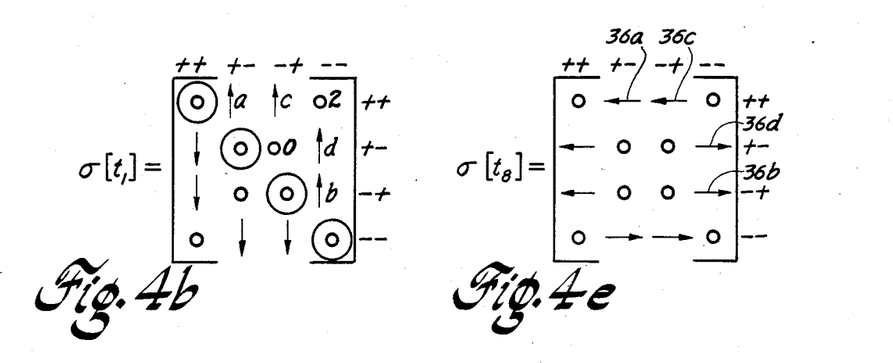
Figures 4C, 4F:
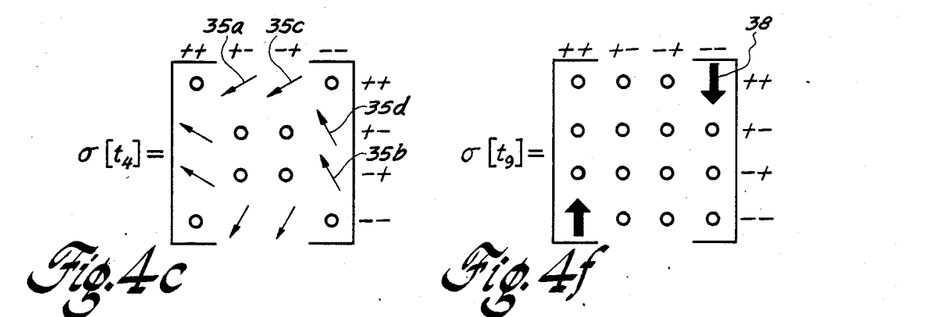
Figure 4D:
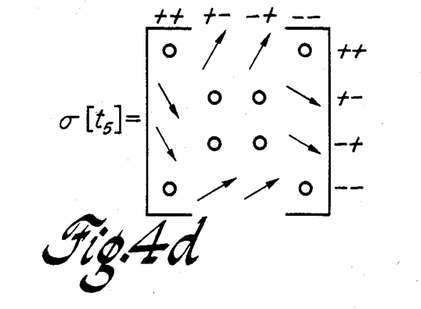

Referring now to FIG. 4, one presently preferable set of signal waveforms for obtaining non-single-quantum coherence responses is illustrated for a Nuclear Magnetic Resonance system in which a set of three mutually-orthogonal magnetic field gradients $G_X$, $G_Y$ and $G_Z$ (along the respective X, Y and Z axes of a Cartesian-coordinate NMR imaging/spectroscopy system as known to the art) are generated; also shown are the amplitude characteristics of the ratio-frequency (RF) signals utilized along with the magnetic field gradients to excite the nuclei of matter lying in a defined sample slice. These signals not only stimulate the non-single-quantum coherences to provide a response signal, but also convert the response signal into a quasi-single-quantum form (as the true single-quantum signals are themselves converted to self-cancelling form) for reception at the RF spectrometer receiver of the NMR system. The novel methods of my invention use a zero-quantum/multiple-quantum signal subsequence 20, prior to any of a large group of response-signal-evoking NMR sequence 22 (such as a standard spin-warp excitation sequence, as illustrated, and the like) as known to the art.

In accordance with one principle of the present invention, subsequence 20 provides conditions necessary for the spin magnetization to change phase sinusoidally at a rate determined by the non-single-quantum transition frequency; the instantaneous phase of the desired non-single-quantum coherence is then converted by a detection pulse. The illustrated subsequence embodiment commences, at a time $t_0$, with the leading edge 25a of a first RF signal 25; this signal is a $\pi/2$, or 90°, signal pulse. The sample is irradiated by the pulsed RF signal 25 with all three magnetic field gradients having substantially zero amplitude. The RF pulse signal has a substantially square envelope and a phase $\phi_a$ selectably established at one of a plurality of phases, with respect to a reference phase; one apparatus in which the phase of a RF signal can be selected was described and claimed in co-pending application Ser. No. 779,338, filed on Sept. 23, 1985, assigned to the assignee of the present application and incorporated herein in its entirety by reference. Pulse signal 25 returns to a substantially zero amplitude with a trailing edge 25b at time $t_1$. A second RF signal pulse 27 has a leading edge 27a which occurs at a later time $t_4$; this signal pulse 27 is a $\pi$, or 180°, signal pulse. This spin-inversion RF pulse signal also has a substantially square envelope and is provided at a phase $\phi_b$ which is an independently selected one of the plurality of available phases. The second RF signal pulse ends with a trailing edge 27b at time $t_5$. The second RF pulse signal 27 is provided with timing such that the temporal midpoint 27c thereof is at the end of a first subsequence time interval, having a duration T, which commences at substantially at the temporal midpoint 25c of the first RF signal pulse. The duration T of the subsequence time interval is established to be proportional to the reciprocal of the spectral line frequency difference J, i.e., $T=N/(4J)$, where $N=1,3,5,\ldots$; for $N=1$, a coupling constant J range of about 10–1000 Hz., illustratively, results in a range of about 0.25–25 milliseconds for time interval T. The actual duration of the time interval T is not particularly critical because, as was previously mentioned, the amount of multiple-quantum coherence (in the absence of any spin relaxation) varies sinusoidally as a function of T (e.g., where the amount MQC(t) of the non-single quantum coherence is given by $MQC(t) = A \cos(\omega t)$, wherein t is the elapsed time from the establishment of the non-single-quantum coherence and $\omega$ is the sum, for multiple quantum transitions, or the difference, for zero-quantum transitions, of the resonance offset frequencies (rather than the Larmor frequencies), and is at a maximum when $T=(2L+1)/4J$, where L is a positive integer (including zero). A third RF signal 29 has a leading edge 29a occurring at a time $t_8$; this signal is a RF signal pulse which may, but need not, have some additional phase shift $\theta$ relative to the phase of pulse 25 and which has a duration selected to be a multiple K of $\pi/4$, i.e., to a impart a nuclear rotational effect of K·45°. This RF signal pulse, with a substantially square envelope, has a trailing edge 29b at a later time $t_9$. In the illustrated subsequence embodiment, $K=2$ and pulse signal 29 is a 90° RF pulse. The temporal midpoint 29c of this third RF signal pulse is selected to occur essentially at the end of the same time interval T, after the center 27c of the second pulse, as the time interval T present between pulse time centers 25c and 27c. It should be understood that the non-single-quantum coherences could have been excited by a subsequence comprised only of 90° pulses 25 and 29, separated by $T=1/4J$, but at a decreased efficiency, due to dependence upon the degree of resonance offset; the addition of the $\pi$ signal pulse 27 removes this dependency. Pulses 25, 27 and 29 thus serve to excite the non-single-quantum coherences, but the subsequent spin-warp sequence 22 can only operate upon single-quantum coherence type signals. A process to convert non-single-quantum coherence type signals to single-quantum coherence type signals must be present.

Figure 4G:
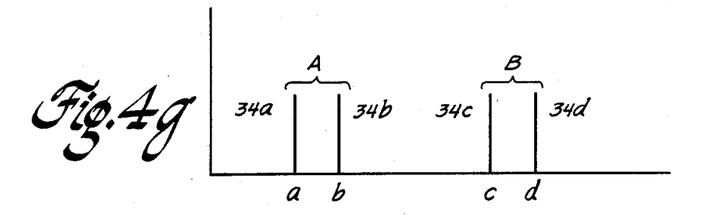
FIG. 4g is a frequency-domain amplitude graph of the expected response from the spin-density matrix of FIG. 4b.

An application of a spin-vector model, to this $\pi/2$-T-$\pi$-T-$\pi/2$ pulse subsequence, would predict that an spin-echo response signal would be generated and all spin magnetizations would be placed in an inverted condition by the second $\pi/2$ RF pulse signal; this result is only true for uncoupled spins, such as those of $^1$H nuclei in $H_2O$ and the like. Different behavior is exhibited by coupled spins; for example, echo formation does not occur responsive solely to this subsequence. Moreover, ordinary spin-vector models will not adequately predict the behavior of spin-coupled nuclei; a time-wise analysis must be made by subjecting an original spin-density matrix to the appropriate rotational operators and scalar multipliers, to obtain the various spin-density matrices $\sigma[t]$, as illustrated in FIGS. 4a–4f for a relatively simple AB spin-$\frac{1}{2}$ system, similar to that discussed with respect to FIGS. 2a and 2b. The spin-density matrix $\sigma[t]$ is a square matrix, having $(m+1)\times(n+1)$ elements per side, where m and n are the order subscripts for the $A_m B_n$ system, and where each of the matrix elements contains the correlation between one possible pair of initial and final system energy states. At the start of subsequence 20 at time $t_0$, as shown in the first spin-density matrix $\sigma[t_0]$, the nuclear spins are at equilibrium and coherences do not exist. All off-diagonal elements of the spin-density matrix are zero and the only non-zero on-diagonal elements are at positions [1,1] and [4,4], with oppositely directed spins, e.g., in the horizontal direction. Responsive to the first $\pi/2$ pulse 25, illustratively having a phase of 0°, application of the appropriate rotational operator to matrix $\sigma[t_0]$ results in the matrix $\sigma[t_1]$ and illustrates that coherences have been generated in all of the single-quantum matrix elements, i.e., elements [1,2], [1,3], [2,1], [2,4], [3,1], [3,4], [4,2] and [4,3]; the potential double-quantum elements [1,4] and [4,1] are still unactivated. Responsive to the pulse, all of the coherences must correspond to magnetization along the Y axis, i.e., in the vertical direction, so that the spins to the right of the matrix diagonal are upwardly directed, and their image spins, to the left of the diagonal, all are downwardly directed. The response signals comprise the pair of doublets shown in FIG. 4g (a first doublet A of signals 34a and 34b corresponding to the single-quantum coherences a and b, respectively, and a second doublet B of signals 34c and 34d corresponding to the single-quantum coherences c and d, respectively). After evolution for the time interval $T=\frac{1}{4}J$, the spin-density matrix $\sigma[t_4]$ is obtained at time $t_4$. The phase of each of the various coherences has changed; its absolute phase is a function of its frequency offsets. The relative phase difference between the components of each doublet A and B (FIG. 4g) remain at 90°, due to the J spacing between the resonances. The 180° pulse signal 27 rotates the spin phases to those shown in the spin matrix $\sigma[t_5]$ of FIG. 4d, and the evolution thereof in the following time interval T brings the coherences to the X-axis spin magnetizations of the $\sigma[t_8]$ matrix of FIG. 4e. However, each coherence, corresponding to one of the peaks of a doublet, has a polarity opposite to that of the polarity of the other doublet coherence (which may be considered analogous to anti-phase magnetization in a spin-vector model); the second 90° pulse signal 31 provides a rotational operator which results in the spin-density matrix $\sigma[t_9]$ of FIG. 4f. The pair of components (e.g., spin elements 36a and 36c, or spin elements 36b and 36d) of each single-quantum coherence doublet can now be manipulated, due to their phase rotation in opposite directions, to eventually substantially cancel one another. However, total double-quantum coherence 38 is now generated, and, because of the presence of the $\pi$ signal pulse 29, has an amplitude which is substantially independent of the amount of resonance offset.

In accordance with another principle of the present invention, the non-single-quantum coherence signals, present after the cessation of the third subsequence pulse 29, are converted to single-quantum coherence-like detectable signals by application of a detection RF signal pulse 31 to the sample under investigation. This pulse serves to align non-single-quantum signals both into the reception plane (e.g., the X-Y transverse plane) and into phase with one another, while setting the phases of single-quantum coherence generated signals into opposition with one another. In a series of subsequence/sequence interrogations of the sample, with the subsequence pulse signal phases being manipulated in a predetermined manner (typically having $2^p$ repetitions, where p is an integer greater than zero), a particular order of the non-single-quantum signals can be made to add constructively, while the single-quantum signals can be made to exhibit cancellation therebetween. The degree of cancellation of single-quantum coherence generated signals generally increases for a phase program having an increased number of phase combinations, although an increased repetition program requires increased time for completion. One detection pulse 31 useful in such a multiple-step phase program is the illustrated pulse, which may also have a substantially square envelope, commencing with a leading edge 31a and having a trailing edge 31b thereafter at a time sufficient to cause pulse 31 to be a 180°, or $\pi$, pulse. The detection pulse temporal centerpoint 31c occurs at a selected detection time interval $T_d$ after the temporal center 29c of the third subsequence pulse.

While detection pulse 31 may be the slice-selective RF pulse signal at the start of the standard spin-warp imaging sequence, a more general experiment may use a spin warp imaging sequence 22 which commences at a start time $t_s$ after the completion of the detection pulse 31. A Y-axis magnetic field gradient $G_Y$ signal 40, with the required one of a multiplicity of amplitudes, and a X-axis magnetic field gradient $G_X$ signal 42, with its required amplitude, define the phase-encoded "stripe" of the sample to be imaged. The subsequent 180° RF pulse signal 44 appears with a Z-axis magnetic field gradient $G_Z$ signal portion pulse 46a, and selects a transverse slice of the sample to be imaged; the sinc-modulated RF pulse serves to relatively sharply define the slice top and bottom edges. A $G_Z$ rephasing portion pulse 46b may be used in the spin-warp sequence, in known manner; this signal may be quite helpful, in that the non-single-quantum coherence signals, having been converted to single-quantum-like signals by detection pulse 31, can exhibit all of the same effects, including dephasing. The timing between pulse 31 and the subsequent slice-selection pulse 44 is such that this time interval, which is (n−1)T, is sufficient to have a total magnetization rotation of $(\frac{1}{2}J)$ cycle greater than an integer number of cycles, i.e., $nT=q+(\frac{1}{2}J)$ cycles, where q is an integer, so that proper phase is restored to each frequency spectra multiplet, prior to response signal acquisition. Thus, the multiplet spins, which were in alternating phase, and therefore pointing in opposite directions, experience a delay $\frac{1}{2}J$ sufficient to allow attainment of the same phase. Therefore, the resulting spin-echo response signal 50 will be centered about a time $t_y$ which occurs the same time interval nT after the selection pulse center time $t_x$. The receiver of the NMR spectrometer is therefore advantageously so gated as to accept sample response signals 50 only during a temporal window 52 centered on response interval center time $t_y$. The phase of the received response signal is shifted in the receiver, using apparatus such as was described in the aforementioned co-pending application, by an amount determined by that one of the multiple-step phase cycling programs being then utilized to realize cancellation of the single-quantum response signals and reception of the non-single-quantum response signals. A repetition time interval $T_r$ occurs between the start of a present one of the $2^p$ phase-cycled repetitions of the non-single-quantum subsequence 20 and imaging sequence 22, and the next one of these repetitions.

The simplest class of the $2^p$-step phase-cycling programs is the two-step program set for p=1, one example might be:

| Step Number | $\phi_{25}$ | $\phi_{27}$ | $\phi_{29}$ | $\phi_{31}$ | $\phi_r$ |
| --- | --- | --- | --- | --- | --- |
| 1 | 0 | +90 | 0 | — | 0 |
| 2 | +90 | 180 | +90 | — | 180 | where all angles $\phi$ are in degrees, and $\phi_r$ is the phase change introduced, in the receiver, to the received response signals. Note that the phase ($\phi_{31}$) of the detection pulse need not be shifted in this sequence. There are many possible programs for realizing a higher degree of single-quantum coherence signal cancellation. One useful p=2 four-step phase-cycling program, where all angles $\phi$ are again in degrees, is:

| Step Number | $\phi_{25}$ | $\phi_{27}$ | $\phi_{29}$ | $\phi_{31}$ | $\phi_r$ |
|---|---|---|---|---|---|
| 1 | 0 | +90 | 0 | — | 0 |
| 2 | +90 | 180 | +90 | — | 180 |
| 3 | 180 | −90 | 180 | — | 0 |
| 4 | −90 | 0 | −90 | — | 180 |

Many other phase-cycling programs exist; the number increases as the order parameter p is increased. While many such programs exist, one illustrative phase-cycling program for (p=4), with $2^p=4=16$ steps, can be obtained by imposing a set of initial and/or final conditions on at least one phase. One such program, with all angles $\phi$ being given in degrees, is:

| Step Number | $\phi_{25}$ | $\phi_{27}$ | $\phi_{29}$ | $\phi_{31}$ | $\phi_r$ |
|---|---|---|---|---|---|
| 1 | 0 | +90 | 0 | 0 | 0 |
| 2 | 0 | +90 | 0 | +90 | −90 |
| 3 | 0 | +90 | 0 | 180 | 180 |
| 4 | 0 | +90 | 0 | −90 | +90 |
| 5 | +90 | 180 | +90 | 0 | 0 |
| 6 | +90 | 180 | +90 | +90 | −90 |
| 7 | +90 | 180 | +90 | 180 | 180 |
| 8 | +90 | 180 | +90 | −90 | +90 |
| 9 | 180 | −90 | 180 | 0 | 0 |
| 10 | 180 | −90 | 180 | +90 | −90 |
| 11 | 180 | −90 | 180 | 180 | 180 |
| 12 | 180 | −90 | 180 | −90 | +90 |
| 13 | −90 | 0 | −90 | 0 | 0 |
| 14 | −90 | 0 | −90 | +90 | +90 |
| 15 | −90 | 0 | −90 | 180 | 180 |
| 16 | −90 | 0 | −90 | −90 | +90 |

In each of these phase-cycling programs, the response signal resulting from a latter excitation is (after reception and processing) subtracted from the response signal (already received and processed) from an earlier excitation. In the p=1 two-step program, the second response is acquired and subtracted from the acquired first response; since the phase-shift has no effect on the single-quantum coherences, their similar responses are substantially subtractively cancelled. Because even orders of multiple-quantum coherence are inverted by a 90° phase shift in the excitation subsequence, the response signals from spins which have gone though multiple-quantum coherence will combine when the earlier and latter response signals are subtracted. The use of phase-cycling programs have more than two differently phased subsequences is normally required to minimize pulse imperfection effects. I have used the above illustrated and similar phase-cycling programs, with up to p=6 (e.g., 64 steps), for obtaining multiple-quantum signal "filters"; having typical rejections of about 2500 times, and occasionally as high as 13,000 times, of adjacent water-based $^1H$ response signals were obtained with p=5 (i.e., 32 steps) filter. It should be understood that longer programs, with p=9 or greater, can be calculated and used, if required.

The addition of a pair of pulse signals, such as provided by signal pulses 56 and 58, in that magnetic field gradient (here, gradient $G_Z$) along the central axis of the NMR system (here, the Z-axis) can be utilized to select the order N of the coherence to be evoked. The first magnetic field gradient pulse 56 is temporally positioned to occur at the end of the evolution interval but before the detection pulse 31; thus pulse 56 is temporally located between RF signal pulses 29 and 31. Pulse 56 commences with a leading edge 56a which occurs at a time $t_c$ later than the time $t_9$ at which the subsequence first RF signal pulse trailing edge 29b occurs. The first $G_Z$ pulse terminates with a trailing edge 56b, at a later time $t_d$, which occurs prior to the time $t_e$ at which the detection pulse leading edge 31a occurs. A second magnetic field gradient pulse 58 is temporally positioned to occur after the detection pulse 31 but before the beginning of the imaging sequence 22. Pulse 58 commences with a leading edge 58a which occurs at a time $t_g$ later than the time $t_f$ at which the detection pulse trailing edge 31b occurs. The second $G_Z$ pulse terminates with a trailing edge 58b at a later time $t_b$, which is prior to the time $t_s$ at which the main imaging sequence 22 commences. The amplitude-duration product of the second pulse 58 is N times greater than the amplitude-duration product of the first pulse 56; only spins with N-th quantum coherence will be detected, as all spins of other orders will be dephased.

While theoretically unnecessary, for a real NMR imaging system I have found helpful the addition of a matched pair of pulse signals, such as provided by signal pulses 60 and 62, in the central axis magnetic field gradient (e.g., gradient $G_Z$ along the Z-axis) and symmetrically disposed about RF signal $\pi$ pulse 27. These pulses can be utilized to remove spurious magnetization and the like effects in the transverse (e.g., the X-Y) plane; such effects may be caused by the refocusing pulse 27 being other than perfectly rectangular or the like. Thus, the first $G_Z$ pulse 60 has a leading edge 60a at a time $t_2$, later than the time $t_1$ at which the first $\pi/2$ pulse 25 ends, and has a trailing edge 60b at a time $t_3$, prior to the start of $\pi$ pulse 27; pulse 60 thus has a duration of $(t_3-t_2)$. This is essentially the same duration as that of the second pulse 62, which has a leading edge 62a at a time $t_6$, later than the time $t_5$ at which $\pi$ pulse 27 ends, and has a trailing edge 62b at a time $t_7$, prior to the start of the K·$\pi$/4 pulse 29. Both pulses 60 and 62 have essentially the same amplitude M.

Modulation of the non-single-quantum coherence may result in the attenuation, or even loss, of the signal from that coherence; the degree of attenuation varies, as previously indicated, as a function of the time relationships of pulses 25, 27 and 29. A refocusing effect, to form a non-single-quantum echo signal, can be provided during a time interval between the end of the non-single-quantum coherence generating portion of the subsequence (e.g., at the end of the K·$\pi$/4 pulse) and the subsequent imaging sequence. Advantageously, positioning of a refocusing pulse prior to the detection pulse allows the detection pulse to be applied at a time during the multiple quantum echo, so that the maximum amount of coherence can be detected. I have also found that, while not theoretically needed, or even essential to a practical utilization of the abovedescribed processes, a refocusing $\pi$ RF signal pulse 64 during the evolution time interval $T_d$ can rephase the non-single-quantum transitions so that the phase thereof at time $t_e$ is substantially the same as the phase at time $t_9$, thus removing a phase error which is dependent upon the excitation resonance frequency offsets. Thus, pulse 64 has a leading edge 64a at a time $t_a$, after the time $t_9$ at which the second $\pi/2$ pulse 29 of the subsequence ends, and has a trailing edge 64b at a time $t_b$ before the leading edge 31a of the detection pulse. The time interval $T_c$, between the refocusing pulse temporal midpoint 64c and the second pulse temporal midpoint 29c, is ideally one-half the time interval $T_d$; in the present embodiment, signal pulse 64 will have a phase substantially the same as the phase of the first rephasing pulse 27, although step-bystep variations in the phase of pulse signal 64 may be employed in some conceivable phase-cycling programs.

Figure 5A:
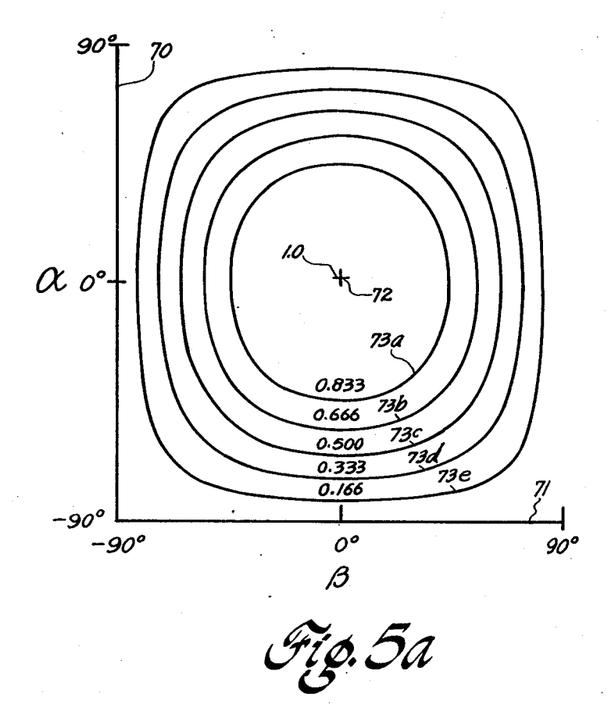
FIGS. 5a and 5b are diagrams illustrating the respective amount of double-quantum and single-quantum coherent signals obtained for the excitation subsequence of FIG. 4, for an AB spin system and with various error magnitudes of flip angle of the first and second 90° RF pulse signals.
Figure 5B:
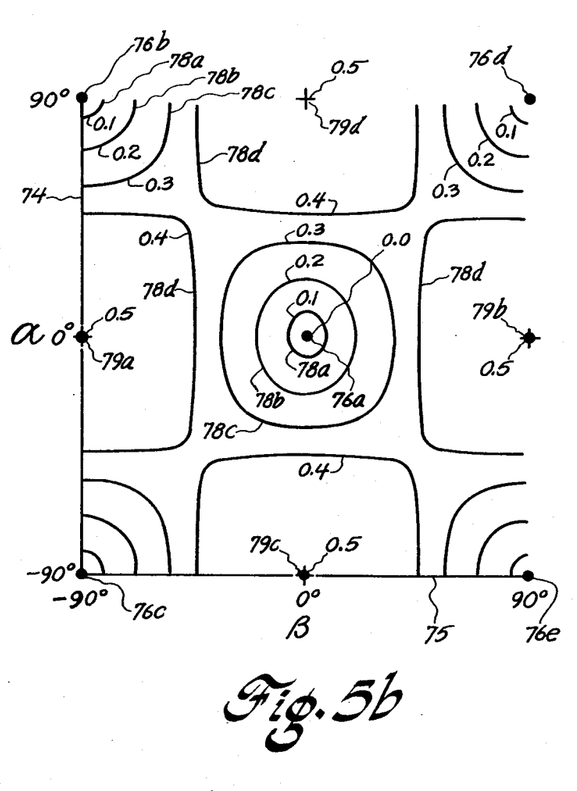

Referring now to FIGS. 5a and 5b, the normalized amount of double-quantum coherence (FIG. 5a) and single-quantum coherence (FIG. 5b) generated by a subsequence of $P_1(\pi/2+\alpha)$-T-$\pi$-T-$P_2(\pi/2+\beta)$ is graphed as a function of the rotational effect of the respective flip angle error ($\alpha$) of pulse $P_1$ (graphed along ordinate 70) and flip angle error ($\beta$) of pulse $P_2$ (graphed along abscissa 71), where T=$\frac{1}{4}$J. Thus, while the amount of double-quantum coherence is at a maximum (i.e., has a normalized amplitude of 1.0) for $P_1=90°$ and $P_2=90°$ (i.e., with $\alpha=\beta=0°$, at point 72), the amplitude is not especially sensitive to moderate flip angle error; a double-quantum coherence amplitude of not less than five-sixths (0.833 . . . ) is still obtained for all combinations of flip angles $P_1$ and $P_2$ on, or within, an inner-most contour 73a. Other contours 73b–73e are marked with the associated amplitude of double-quantum coherence; it will be seen that relatively large flip angle errors are required before the amplitude has decreased to 0.5. In FIG. 5b, where the amplitude of the single-quantum coherence response signal is graphed for combinations of flip angle error $\alpha$ along ordinate 74 and flip angle error $\beta$ along abscissa 75, it will be seen that the minimum (essentially zero) amplitude of single-quantum coherence signal is obtained at center point 76a (with $P_1=\pi/2=90°$ and $P_2=\pi/2=90°$), where $\alpha=\beta 0°$ and the double-quantum coherence signal is maximized. While minimum single-quantum coherence response is also obtained at other points 76b–76e, it will be seen that these four points all reuire the at least one, if not both, flip angles be either 0° or 180°, at which angles the associated amplitude of the double-quantum coherence response signal is essentially zero. The single-quantum coherence response signal amplitude contours 78a–78d illustrate that this response reaches a normalized maximum of only 0.5 at those points 79a–79d where one of the flip angles is 90° and the other flip angle is either 0° or 180°. There is no appreciable amount of zero-quantum coherence response signal generated by this subsequence.

Figure 6A:
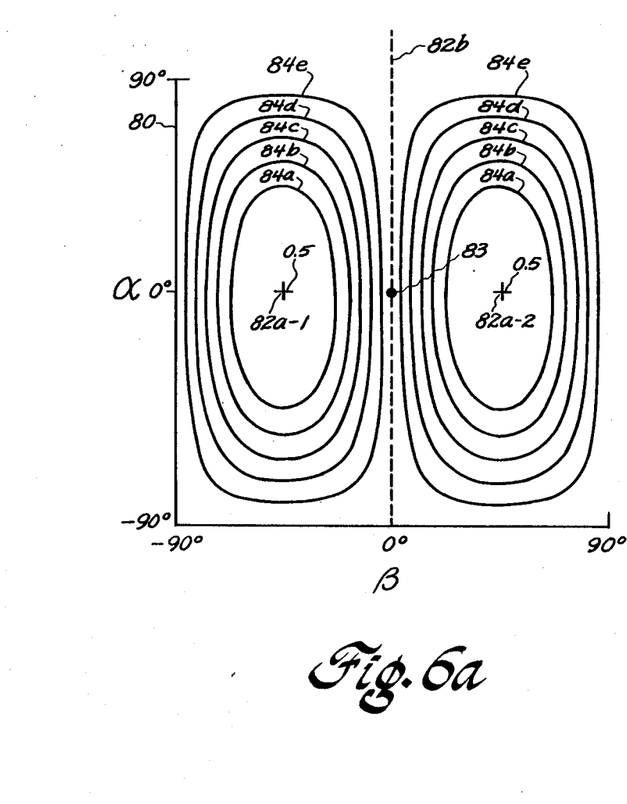
FIGS. 6a and 6b are diagrams illustrating the respective amount of zero-quantum/double-quantum and single-quantum coherent signals for the same excitation subsequence, modified for a 90° change in the phase of the second RF pulse signal.
Figure 6B:
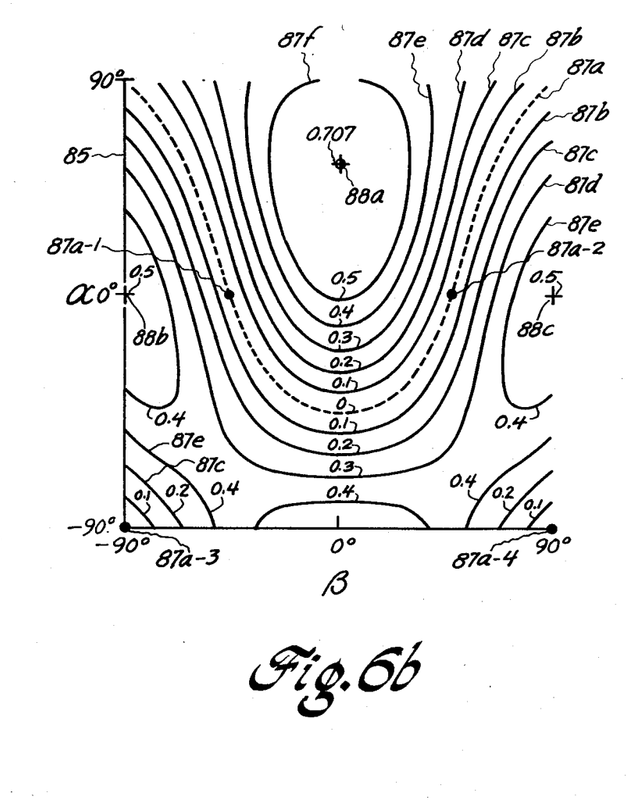

Referring now to FIGS. 6a and 6b, the normalized amount of zero-quantum and double-quantum coherence (FIG. 6a) and single-quantum coherence (FIG. 6b) generated by a subsequence of $P_1(\pi/2+\alpha)$-T-$\pi$-T-$P_2(\pi/2+\beta)$, where $P_2$ has been shifted by 90° in phase with respect to the phase of pulse $P_1$, is graphed as a function of the rotational effect of the respective flip angle error ($\alpha$) of pulse $P_1$ (graphed along ordinate 80) and flip angle error ($\beta$) of pulse $P_2$ (graphed along abscissa 81). The desired flip angles of $P_1=\pi/2=90°$ and, with K=1, $P_2=\pi/4=45°$ (or, with K=3, $P_2=3\pi/4=135°$) at points 82a-1 (or 82a-2) result in a normalized maximum of 0.5 of zero- and double-quantum coherence response signals. Unlike the $\pi/2$-T-$\pi$-T-$\pi/2$ subsequence of FIGS. 5a and 5b (in which the phase of the second $\pi/2$ signal phase was equal to the phase of the second $\pi/2$ signal pulse), substantially equal amounts of zero-quantum and double-quantum coherence are generated by this $\pi/2$-T-$\pi$-T-$\pi/4$ subsequence. Thus, the signal-to-noise ratio of a zero-quantum coherence response is one-half the signal-to-noise ratio of the corresponding double-quantum coherence response. Because zero-quantum transitions are not broadened by inhomogeneous magnetic fields, while all other types of coherences are broadened, homospoil pulses 56 (see FIG. 4) can be used (e.g., after the $\pi/4$ pulse 29, with K=1) to destroy undesired single-quantum and multiple-quantum coherence response signals without substantially affecting the magnitude of the zero-quantum coherence response signals. Note the substantially zero magnitude of non-single-quantum coherence response signals generated along line 82b with the flip angle of the $P_1$ pulse being essentially equal to $\pi/2=90°$; the large oval patterns of contours 84a–84e indicated that relatively large errors $\alpha$ in $P_1$ flip angle and somewhat smaller $\beta$ errors in flip angle $P_2$ can be easily tolerated without substantial decrease in the amplitude of the desired non-single-quantum coherence response signal. The single-quantum coherence response signal produced by this subsequence is, as illustrated in FIG. 6b where flip angle error $\alpha$ is plotted along ordinate 85 and flip angle error $\beta$ is plotted along abscissa 86, of essentially zero amplitude at the expected points 87a-1 and 87a-2 (the points, with $P_1=\pi/2$ and $P_2=\pi/4$ or $3\pi/4$, at which the non-single-quantum coherence response signal amplitude is maximum), and also along the entirety of a zero amplitude line 87a and at points 87a-2 and 87a-3. The single-quantum coherence response signal is at an absolute normalized maximum, of amplitude 0.707 . . . , at point 88a, and has relative maxima, with amplitude 0.5, at a pair of points 88b and 88c.

Figure 7A:
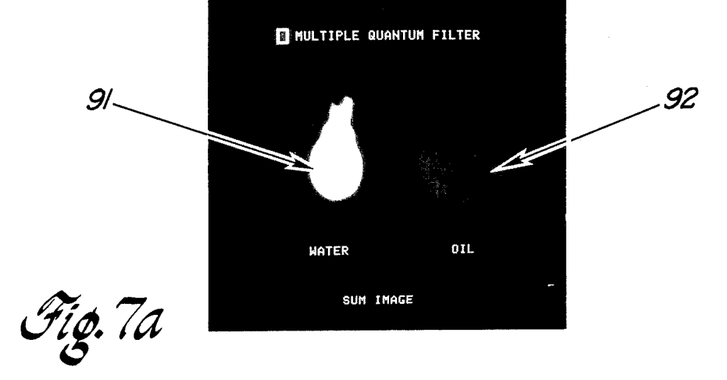
FIGS. 7a and 7b are photographs of NMR images generated of phantom objects having high percentages of different species of the same nuclei, and illustrating the relative visually-differential characteristics provided by my novel methods for multiple-quantum filtering.
Figure 7B:
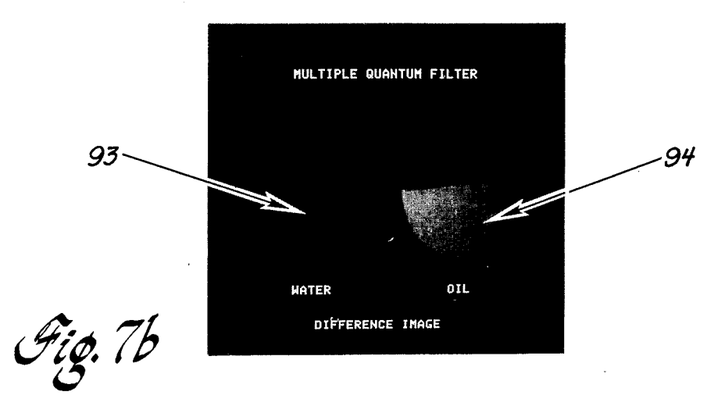

Referring now to FIGS. 7a and 7b, the practical benefits of the above-described methods can be seen for images acquired on a research NMR system with a 1.5 Tesla main static magnetic field and using the phase-manipulative apparatus of the aforementioned co-pending application. Each excitation at one of the $2^p$ different subsequence phase combinations generates a multiple-quantum coherence which is either in-phase or anti-phase; data collected for each in-phase response is added to a first data buffer, while data collected for each anti-phase response is added to a second buffer. Adding the contents of the two buffers preserves the single-quantum coherent signals and cancels those signals having multiple-quantum coherence phase characteristics. Subtraction of the contents of the two buffers suppresses the single-quantum response signals and retains the multiple-quantum components.

A pair of phantoms were created; the first phantom is a vial containing colored ($CuSO_4$-doped) water and the second phantom is a polyethylene bottle approximately one-half full of lipid simulant (light machine oil). The phantoms were imaged with a spin-warp pulse sequence preceded by a multiple-quantum-filter subsequence with the pair of MQC pulses 25 and 29, the refocusing pulse 27 and the detection pulse 31. A coupling constant J of 10 Hz. was assumed, resulting an interpulse delay T of about 25 milliseconds; a delay time interval $T_d$ of about 35 milliseconds was used in both the spin-warp imaging sequence. A sequence repetition time interval $T_r$ of 600 milliseconds was used. The simplest two-step (p=1) phase cycle was also used.

In FIG. 7a, the photographed summation image shows information obtained from spins exhibiting single-quantum coherence. An image 91 appears of the uncoupled spins in the water phantom. Since the oil is comprised of nuclei with both coupled and uncoupled spins, an oil image 92 appears in this photograph. The water image is seen to be much more intense, as the number of non-coupled spins in the oil sample is relatively small. The difference image of FIG. 7b shows that, when only the coupled spins are filtered for display, the water image 93 substantially disappears (being suppressed here by a factor in excess of 100), while the oil image 94 is just as apparent, if not more so.

Figure 7C:
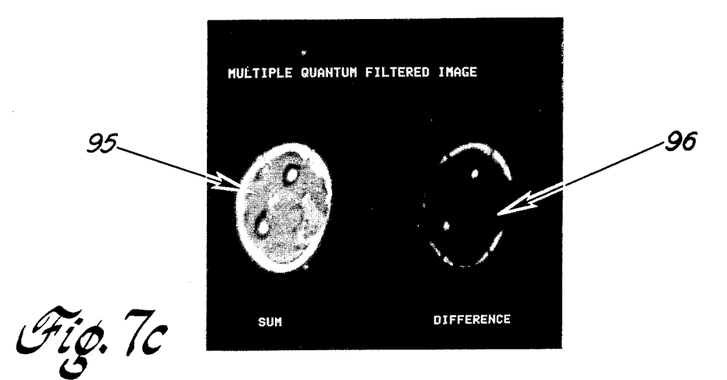
FIG. 7c is a photograph of a pair of transverse images taken through the forearm of a volunteer subject, illustrating the ability of my invention to remove the response from tissue having a high content of an undesired nuclear species with a single-quantum coherence, to accentuate the response for a desired nuclear species having a multiple-quantum coherence.

Referring to FIG. 7c, a photograph is shown of the multiple-quantum-filtered image of a transverse section through the forearm of a healthy adult volunteer. The experiment conditions are similar, with an increased $T_r$ of 1000 milliseconds, to the conditions used for FIGS. 7a and 7b. The sum image 95 clearly shows the additive responses from both the non-coupled water in the muscle portion and the fat content; in the difference image 96, the single-quantum water response signals have been rejected and substantially only the multiple-quantum lipid and bone-marrow response signals contribute to the viewable information.

While several embodiments of my novel methods of, and pulse sequences for, the suppression of undesired resonances in NMR imaging and/or spectroscopy by generation of quantum coherence have been described by way of explanation, many modifications and variations will now become apparent to those skilled in these arts. It is my intent, therefore, to be limited only by the scope of the appending claims and not by means of the specific details and instrumentalities presented herein.

What I claim is:

1. A method for suppressing undesired response signals in nuclear magnetic resonance (NMR) imaging while obtaining desired NMR signals receivable from a sample containing nuclei which are spin-coupled to one another, comprising the steps of:

(a) evoking a NMR response signal from the sample responsive to an excitation signal sequence;

(b) preceding each NMR excitation signal sequence with a signal subsequence predeterminately selected for generating at least one selected one of zero-quantum and multiple-quantum coherence of the spin populations of a selected coupled-spin system in the sample;

(c) providing at least one detection signal in the subsequence for converting the at least one selected coherence into a desired NMR response signal receivable from the sample, while simultaneously substantially decreasing the final response amplitude of at least one single-quantum coherence signal present in the total response signal from the sample; and (d) generating an image of the sample responsive to the at least one selected coherence.

2. The method of claim 1, wherein step (b) includes the steps of: generating a first RF magnetic field pulse signal having a substantially 90° duration; and generating a second RF magnetic field pulse signal having a duration of K·45°, where K is a positive integer greater than zero; providing a time interval, between the temporal midpoints of the 90° pulse signal and the K·45° pulse signal, substantially equal to 2T, where T is substantially equal to N/(4J), where N is a positive odd integer and J is the spin-spin coupling constant of the spin system desired; and step (c) comprises the step of: providing the detection signal as a RF magnetic field pulse signal of substantially 90° duration, having a temporal midpoint occurring at a detection time interval $T_d$ substantially equal to 1/(2J) after the temporal midpoint of the K·45° pulse signal.

3. The method of claim 2, wherein the response-signal-evoking NMR sequence of step (a) utilizes a slice-selective RF magnetic field pulse signal; and further comprising the step of positioning the temporal midpoint of the slice-selective RF pulse signal at a time interval of nT=q+(½J), where N and q are each a positive integer, after the temporal midpoint of the detection signal.

4. The method of claim 3, further comprising the step of providing the slice-selective RF signal as a sinc-modulated RF carrier signal.

5. The method of claim 2, further comprising the step of providing a refocusing RF pulse signal of substantially 180° duration and having a temporal midpoint substantially midway between the temporal midpoints of the first and second RF pulse signals.

6. The method of claim 5, wherein responses from a zero-quantum coherence are to be obtained, and further comprising the step of establishing the integer K=1 to cause the second RF pulse signal to have a substantially 45° duration.

7. The method of claim 6, further comprising the step of providing all of the first, second, refocusing and detection RF pulse signals in the essential absence of a magnetic field gradient in the static magnetic field of the NMR system.

8. The method of claim 5, wherein responses from a multiple-quantum coherence are to be obtained, and further comprising the step of establishing the integer K=2 to cause the second RF pulse signal to have a substantially 90° duration.

9. The method of claim 8, further comprising the step of providing all of the first, second, refocusing and detection RF pulse signals in the essential absence of a magnetic field gradient in the static magnetic field of the NMR system.

10. The method of claim 8, further comprising the steps of: providing first and second pulse signals in the gradient magnetic field in a direction parallel to the static magnetic field of the NMR system; providing the first magnetic field gradient pulse signal both with a first product of the amplitude and duration thereof, and also with temporal position to occur after the second RF pulse signal and prior to the detection RF pulse signal; and providing the second magnetic field gradient pulse signal with both an amplitude-duration product which is N times as great as the amplitude-duration product of the first magnetic field gradient pulse signal, where N is a multiple-quantum order integer greater than 1, and with temporal position to occur after the detection RF signal pulse and prior to the commencement of the NMR sequence.

11. The method of claim 10, further comprising the steps of: providing first and second additional magnetic field gradient pulse signals in the direction parallel to the system static magnetic field; providing each additional gradient pulse signal with substantially the same amplitude M; causing the first additional pulse signal to occur after the first RF pulse signal and before the refocusing RF pulse signal and with a temporal midpoint at a time $T_g$ prior to the refocusing pulse temporal midpoint; and causing the second additional pulse signal to occur after the refocusing RF pulse signal and before the second RF pulse signal and with a temporal midpoint at the same time $T_g$ after the temporal midpoint of the refocusing pulse.

12. The method of claim 11, further comprising the step of providing a second refocusing pulse RF signal of substantially 180° duration and having a temporal midpoint occurring at a time $T_c$ essentially midway between the temporal midpoints of the second and detection RF pulse signals.

13. The method of claim 10, further comprising the step of providing a second refocusing 180° RF pulse signal of substantially 180° duration and having a temporal midpoint occurring at a time $T_c$ essentially midway between the temporal midpoints of the second and detection RF pulse signals.

14. The method of claim 8, further comprising the steps of: providing first and second additional magnetic field gradient pulse signals in a direction parallel to the system static magnetic field; providing each additional gradient pulse signal with substantially the same amplitude M; causing the first additional pulse signal to occur after the first RF pulse signal and before the refocusing RF pulse signal and with a temporal midpoint at a time $T_g$ prior to the refocusing pulse temporal midpoint; and causing the second additional pulse signal to occur after the refocusing RF pulse signal and before the second RF pulse signal and with a temporal midpoint at the same time $T_g$ after the temporal midpoint of the refocusing pulse.

15. The method of claim 14, further comprising the step of providing a second refocusing RF pulse signal of substantially 180° duration and having a temporal midpoint occurring at a time $T_c$ essentially midway between the temporal midpoints of the second and detection RF pulse signals.

16. The method of claim 8, further comprising the step of providing a second refocusing RF pulse signal of substantially 180° duration and having a temporal midpoint occurring at a time $T_c$ essentially midway between the temporal midpoints of the second and detection RF pulse signals.

17. The method of claim 2, further comprising the step of: repeating the subsequence-sequence steps for a plurality $2^p$, where p is a positive integer greater than zero, of different combinations of phases, relative to a reference phase, of the first and second RF pulses and the phase of the response signal as evoked from the sample but prior to detection, with each phase being shifted by respective amounts $\phi_a$, $\phi_b$ and $\phi_r$ in a predetermined pattern selected to substantially cancel at least one single-quantum response signal in the detected sample response.

18. The method of claim 16, wherein p is less than 10.

19. The method of claim 2, further comprising the steps of: varying the phases of at least one of the excitation subsequence signals, including the detection signal, and the received response signal; and manipulating the varied phases to cause a single-quantum coherence signal to be substantially cancelled while simultaneously causing constructive addition of the received response signal components associated with the selected one of the zero-quantum coherence and multiple-quantum coherence.

20. The method of claim 1, further comprising the steps of: varying the phases of at least one fo the excitation subsequence signals, including the detection signal, and the received response signal; and manipulating the varied phases to cause a single-quantum coherence signal to be substantially cancelled while simultaneously causing constructive addition of the received response signal components associated with the selected one of the zero-quantum coherence and multiple-quantum coherence.

* * * * *